(12) United States Patent
Chen et al.

(10) Patent No.: US 11,081,391 B2
(45) Date of Patent: Aug. 3, 2021

(54) WAFER LEVEL DICING METHOD AND SEMICONDUCTOR DEVICE

(71) Applicant: Taiwan Semiconductor Manufacturing Company, Ltd., Hsinchu (TW)

(72) Inventors: Ying-Ju Chen, Tuku Township (TW); Hsien-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/019,096

(22) Filed: Jun. 26, 2018

(65) Prior Publication Data
US 2018/0315656 A1    Nov. 1, 2018

Related U.S. Application Data

(62) Division of application No. 14/011,580, filed on Aug. 27, 2013, now Pat. No. 10,008,413.

(51) Int. Cl.
*H01L 23/00*  (2006.01)
*H01L 21/78*  (2006.01)
(Continued)

(52) U.S. Cl.
CPC .............. *H01L 21/78* (2013.01); *B23K 26/40* (2013.01); *H01L 21/56* (2013.01); *H01L 21/561* (2013.01); *H01L 24/04* (2013.01); *H01L 24/10* (2013.01); *H01L 24/14* (2013.01); *B23K 2103/50* (2018.08); *H01L 23/3114* (2013.01); *H01L 23/3192* (2013.01); *H01L 24/05* (2013.01); *H01L 24/11* (2013.01); *H01L 24/13* (2013.01); *H01L 2224/0401* (2013.01); *H01L 2224/05548* (2013.01); *H01L 2224/05567* (2013.01); *H01L 2224/05569* (2013.01); *H01L 2224/05572* (2013.01); *H01L 2224/10126* (2013.01); *H01L 2224/11* (2013.01); *H01L 2224/1134* (2013.01); *H01L 2224/1191* (2013.01); *H01L 2224/133* (2013.01); *H01L 2224/13022* (2013.01); *H01L 2224/13024* (2013.01); *H01L 2224/1329* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13184* (2013.01); *H01L 2224/94* (2013.01); *H01L 2924/12042* (2013.01); *H01L 2924/181* (2013.01)

(58) Field of Classification Search
CPC ......... H01L 21/78; H01L 24/04; H01L 24/10; H01L 24/14
USPC ......................... 257/620, 737, 778
See application file for complete search history.

(56) References Cited

U.S. PATENT DOCUMENTS 6,841,874 B1 * 1/2005 Paek ................... H01L 24/03
257/738
7,176,572 B2 * 2/2007 Hanaoka ............. H01L 21/74
257/723

(Continued)

*Primary Examiner* — Robert T Huber
(74) *Attorney, Agent, or Firm* — Slater Matsil, LLP (57) ABSTRACT

A semiconductor device includes a plurality of connectors and at least one insulating layer disposed over a semiconductor substrate. A molding layer extends around the plurality of connectors. A sidewall of the molding layer that is closest to a scribe line is offset from the scribe line.

20 Claims, 11 Drawing Sheets

(51) Int. Cl.
  *H01L 21/56* (2006.01)
  *B23K 26/40* (2014.01)
  *B23K 103/00* (2006.01)
  *H01L 23/31* (2006.01)

(56) References Cited

U.S. PATENT DOCUMENTS

| | | |
|---|---|---|
| 7,279,775 B2 | 10/2007 | Kim et al. |
| 7,772,091 B2 | 8/2010 | Machida |
| 2004/0238926 A1 | 12/2004 | Obinata |
| 2009/0014871 A1* | 1/2009 | Meyer ............... B81C 1/00301 257/737 |
| 2009/0121321 A1 | 5/2009 | Miccoli et al. |
| 2010/0072635 A1 | 3/2010 | Kuo et al. |
| 2012/0104625 A1 | 5/2012 | Park et al. |
| 2013/0171816 A1 | 7/2013 | Jin |
| 2013/0280861 A1 | 10/2013 | Ma et al. |

* cited by examiner

WAFER LEVEL DICING METHOD AND SEMICONDUCTOR DEVICE

PRIORITY CLAIM AND CROSS-REFERENCE

This application is a divisional of U.S. application Ser. No. 14/011,580, filed Aug. 27, 2013, titled "Wafer Level Dicing Method," which is hereby incorporated herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. Individual dies on a wafer may be formed using semiconductor processing techniques. After device formation, the dies may be cut from the wafer by a saw, laser or the like. The dies may be spaced apart by a dicing street, scribe line or the like to account for the width of the cutting apparatus.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive wafer level dicing system and method, and do not limit the scope of the disclosure.

Embodiments will be described with respect to a specific context, namely making and using interconnects useful in, for example, forming and dicing, singulating or cutting dies or wafers having connectors and back-end-of-line structures. Other embodiments may also be applied, however, to substrates, packages, structures or devices or combinations of any type of integrated circuit device or component.

The embodiments of the present disclosure are described with reference to FIGS. 1 through 10, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
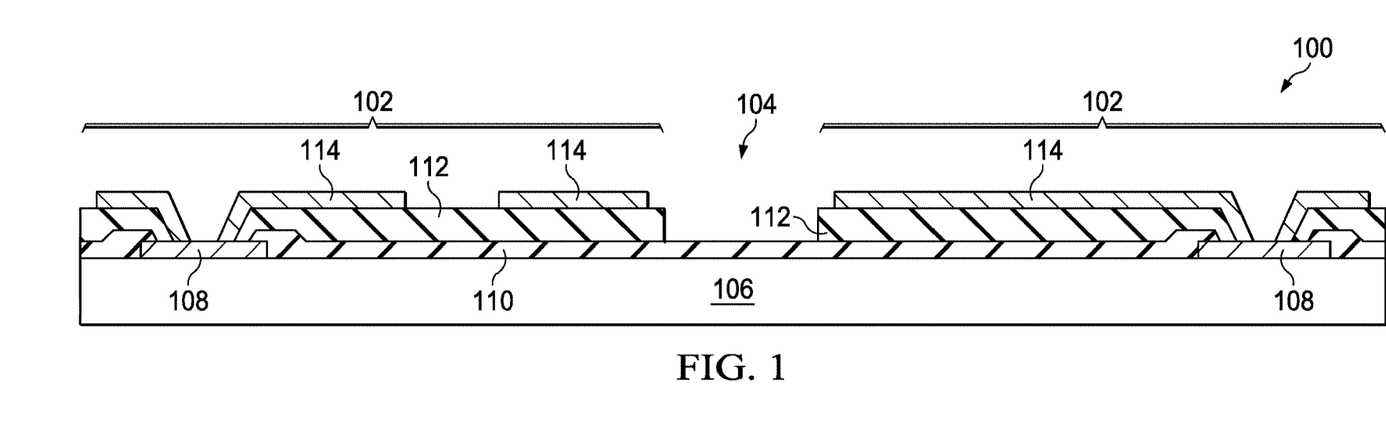
FIGS. 1 through 7 illustrate cross-sectional views of intermediate steps in forming and dicing a wafer having a scribe line free of molding compound according to an embodiment.

FIG. 1 is a cross-sectional view illustrating a wafer 100 having a plurality of dies 102 with post-passivation interconnects (PPI) 114 according to an embodiment. The wafer 100 has one or more contact pads 108 disposed over a substrate 106, and the contact pads 108 are connected to devices formed in the wafer 100. While two dies 102 are shown in the drawings, several dies 102 may be processed on a wafer or workpiece. The wafer is singulated during a subsequent process step. The wafer 100 may have one or more finishing layers such as a passivation layer 110 and a first insulating layer 112 disposed thereon. The wafer 100 may, in some embodiments, have disposed thereon one or more interlayer dielectric layers, intermetal layers, insulator layers, redistribution layers or any other suitable substrate layer. PPI 114 is disposed on the wafer 100 and electrically connected to the contact pad 108, or, in other embodiments, is connected to a through via, land, or the like, and may be disposed on, or formed as part of, a metal layer, or the like. PPI 114 extends horizontally from the contact pad 108. In an embodiment, PPI 114 is formed on the first insulating layer 112 and extends through the first insulating layer 112 and the passivation layer 110 to contact the contact pad 108.

In an embodiment, the first insulating layer 112 is an electrically insulating material such as a polymer, polyimide or dielectric. In an embodiment, the first insulating layer 112 is blanket formed or spin coated, masked and etched, or selectively deposited over a mask. PPI 114 is formed or deposited using an epitaxy process, chemical vapor deposition (CVD), plasma enhanced CVD, or another process. In an embodiment, PPI 114 is copper (Cu), but, in other embodiments, may be polysilicon, gold (Au), aluminum (Al), tantalum (Ta), tungsten (W), or any other suitable conductive material or compound. A copper PPI 114 may, for example, be formed using photolithography and deposition processes such as plasma enhanced chemical vapor deposition (PECVD), physical vapor deposition (PVD), or another deposition process. In another example, the PPI 114 may be formed through masking and electroplating or a similar plating process.

The dies 102 may be discrete dies 102 formed on single wafer 100, with a scribe line 104 or dicing street separating the dies 102. In an embodiment, multiple dies 102 are formed on a single wafer, and the back-end-of-line processes are applied to define the scribe lines.

The scribe line 104 is formed between dies 102 to permit the use of a cutting apparatus to singulate the dies 102 without cutting the dies 102 themselves. The scribe line 104 has a width to accommodate the cutting apparatus and a buffer region to account for variances in cutting or the cutting apparatus. Additionally, layers such as the first insulating layer 112 and PPI 114 may be formed to avoid the scribe line 104. Additionally, subsequent layers such as the second insulating layer 202 (See, e.g., FIG. 2) or molding compound layer 502 (See, e.g., FIG. 5A) may be formed to avoid the scribe line as shown in FIGS. 2-7. Forming the die layers outside the scribe line 104 permits the dies 102 to be cut without damaging the layers. Additionally, the layers are subject to less change of delamination or peeling, resulting in greater die 102 reliability. Additionally, a scribe line 104 without the layers as described permits cutting the wafer 100 with a cutting apparatus such as a laser 702 (See, e.g., FIG. 7) further prevents the layers from absorbing the heat of the laser and introducing reliability problems in those layers.

Figure 2:
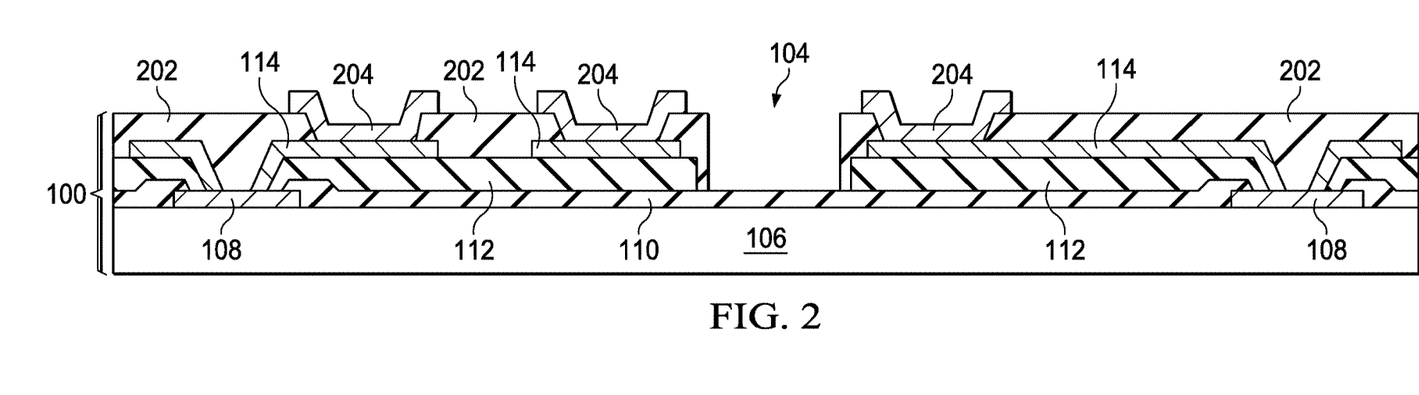

FIG. 2 is a cross-sectional view illustrating application of a land 204 over the PPI 114 according to an embodiment. In a 4-mask arrangement, a second insulating layer 202 is formed over the PPI 114 and a land 204, such as a mounting pad or under bump mount (UBM) is disposed over the second insulating layer and contacting PPI 114. The first insulating layer 112, PPI 114, second insulating layer 202 and land 204 are each formed using separate masks.

In a 3-mask embodiment, the land 204 is omitted, with subsequent layers such as a connector 302 (see, e.g. FIG. 3) formed over the second insulating layer 202 and in contact with the PPI 114. In a 2-mask or ball-on-trace embodiment, both the land 204 and the second insulating layer 202 may be omitted, with subsequent structures on PPI 114.

Figure 3:
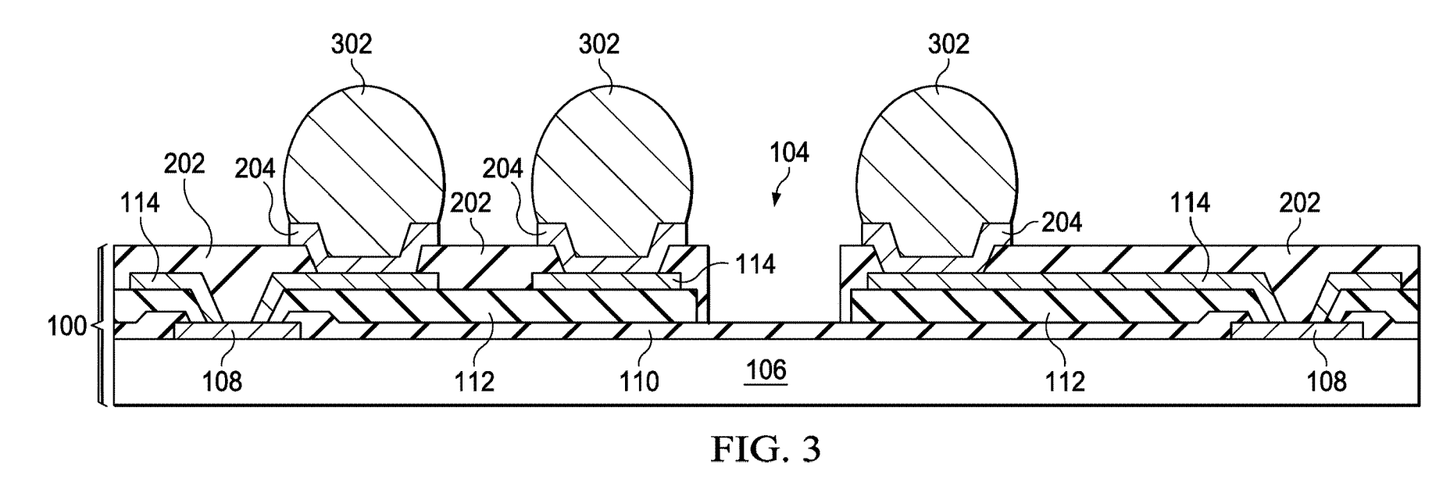

FIG. 3 is a cross-sectional view illustrating application of a conductive connector 302 over the land 204. In the 4-mask arrangement illustrated, the connector 302 is formed on the land 204 and is electrically connected to the contact pad 108 by way of the land 204 and PPI 114. In an embodiment, the connector 302 is a metal such as solder, but may, in other embodiments, be another metal, such as gold (Au), aluminum (Al), lead (Pb), silver (Ag), tungsten (W), tin (Sn), or another metal or alloy. In an embodiment, the connector 302 has a ball shape, but may be a pillar, stud, wire, or others. In another embodiment, the connector 302 is a conductive material such as solder paste, a conductive epoxy or polymer. In an embodiment, the connector 302 is applied to a mounting surface of PPI 114 so that the connector 302 is in electrical contact with the contact pad 108 but not vertically aligned over the contact pad 108.

Figure 4:
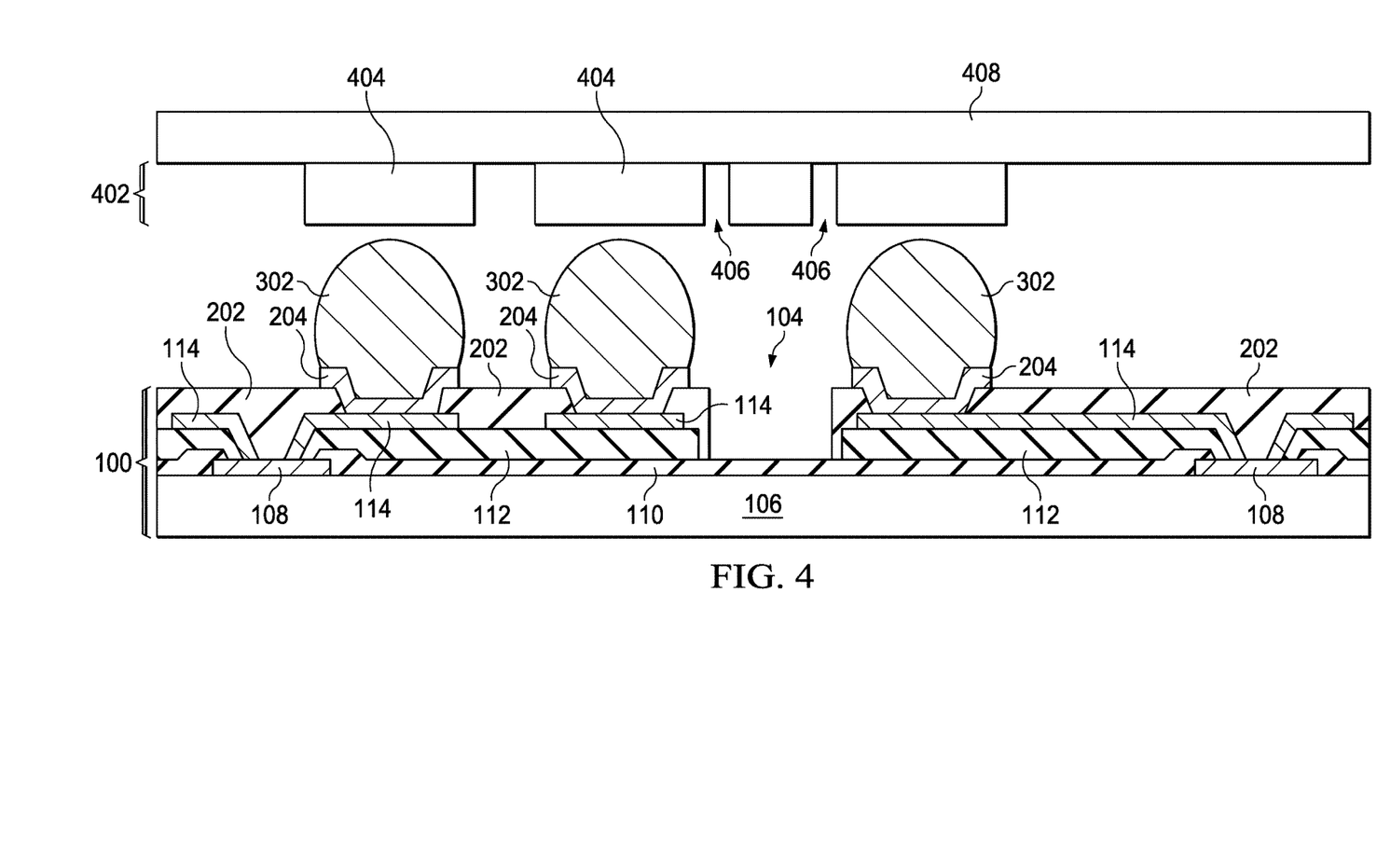

FIG. 4 is a cross-sectional view illustrating application of a stencil 402 and molding compound 408 over the wafer 100 according to an embodiment. The stencil 402 is formed with openings 406 defined by grates 404. The molding compound 408 is forced through the openings 406 in the stencil 402 to shape the molding compound 408 as it is applied. In an embodiment, the molding compound 408 is spin coated onto the top surface of the stencil 402, and then pressed through the stencil 402.

In an embodiment, the molding compound 408 is a nonconductive material, such as a powder or gel epoxy, resin, polymer, polyimide, polybenzoxazole (PBO), benzocyclobutene (BCB), silicone, an acrylate, the like, or a combination thereof. In some embodiments, the molding compound 408 is dispensed in a gel or powder form over the stencil 402.

The molding compound 408 is applied to cover and protect at least a portion of the connector 302 and to provide lateral support to the connector 302 during reflow. In an embodiment, the molding compound 408 is a thermal set polymer or an epoxy that is cured using thermal energy, or a material that cures when exposed to light, UV, air or a catalyst.

The stencil 402 is a solid or rigid material such as glass, metal or the like and, in an embodiment, has a thickness of about 40 μm or more. The stencil openings 406 are arranged so that the molding compound 408 is deposited outside the center of the scribe line 104. The stencil 402 has openings 406 arranged to form the molding compound 408 around the connectors 302 without covering the connectors 302. The stencil 402 may be held about 0.03 mm above the connectors during the application of the molding compound 408. Additionally, the grates 404 are slightly wider than the element that they cover. For example, the grate over the scribe line may be about 0.03 mm wider than the width of the scribe line. In another example, the grate 404 over the connector 302 may be about 0.03 mm wider than the connector 302.

Figure 5A:
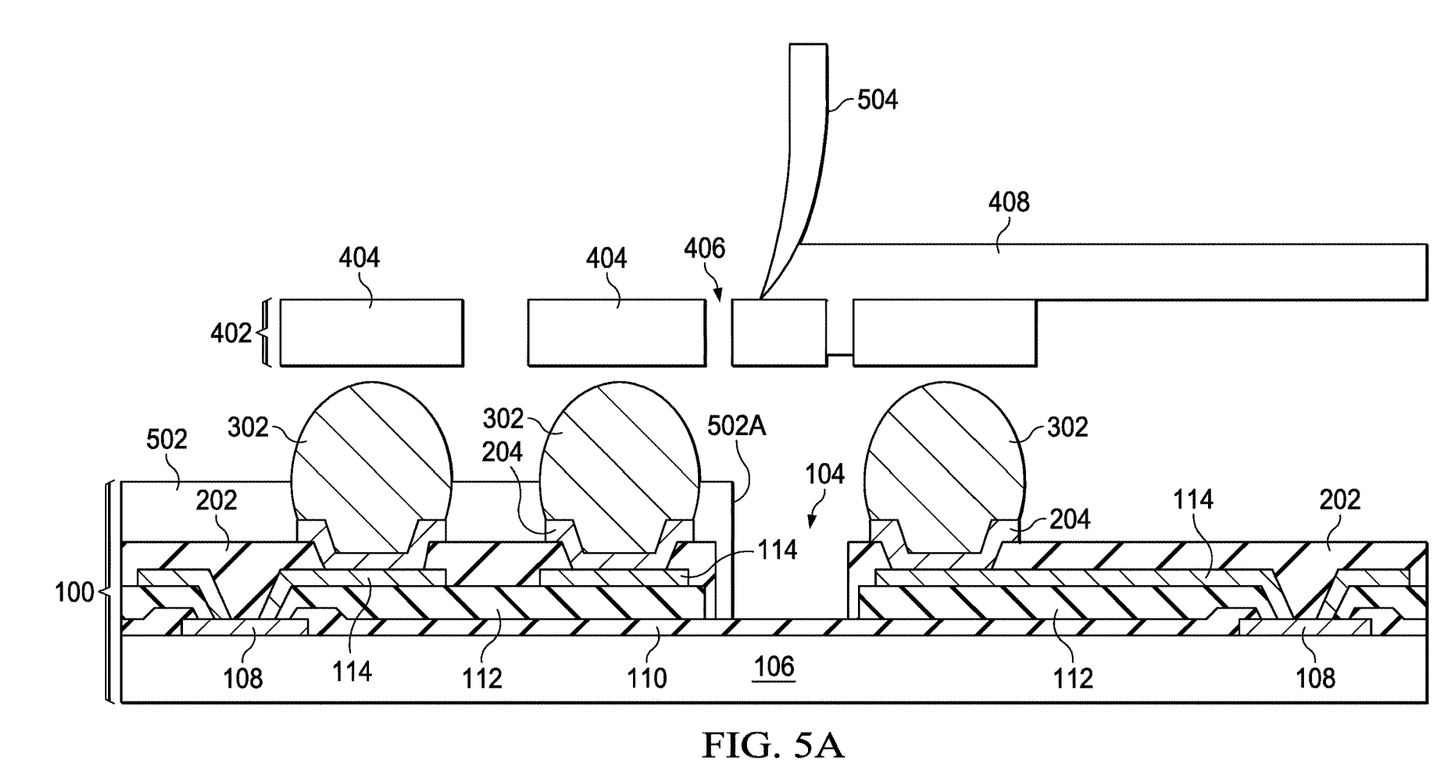

FIG. 5A is a cross-sectional view illustrating forming of the molding compound 408 according to an embodiment. A blade 504, squeegee or other sweeping apparatus may be moved over the upper surfaces of the stencil 402 to force the molding compound 408 through the openings 406 in the stencil 402. The molding compound 408 forms a molding compound layer 502 after being formed through the stencil 402. In an embodiment, the molding compound layer 502 is formed with a substantially flat top surface and is about 100 μm thick over the passivation layer 110, and in another embodiment, the thickness of the molding compound layer 502 over PPI 114 or over the second insulating layer 202 is about 10 μm or greater.

In an embodiment, a roller presses the molding compound 408 through the openings 406 in the stencil 402. The material of the molding compound 408 may be a gel having a viscosity where pressure from the roller will press out voids or air pockets while forcing the molding compound 408 into the features of the structures disposed on the wafer 100. For example, in an embodiment, the molding compound 408 is formed around or pressed under the sidewalls of a spherical or round connector 302, avoiding air pockets at the interface between the connector 302 and second insulating layer 202.

In another embodiment, the molding compound 408 is formed over the PPI 114 and around the connector 302 by forcing the molding compound 408 through the stencil 402 using a pressure plate or the like. In another embodiment, the molding compound 408 is forced through the stencil 402 by compressing the top surface of the molding compound 408 with a rigid or flexible surface. In another example, the molding compound 408 may be formed using an air pressure molding technique, creating a positive pressure environment above the molding compound 408, forcing the molding compound 408 through the stencil 402. Alternatively, the molding compound 408 may be formed with, for example, a flexible mold pressurized pneumatically or hydraulically to press the molding compound 408 through the stencil 402.

In the 4-mask arrangement illustrated in FIG. 5A, the molding compound layer 502 may be formed over and in contact with a portion of the second insulating layer 202 and a portion of the lands 204. The molding compound layer 502 may have a molding compound sidewall 502A that extends from the top or uppermost surface of the molding compound layer 502 to the passivation layer 110. In an embodiment, the passivation layer 110 extends across multiple dies 102 and through the scribe line area 104. In another embodiment, the passivation layer 110 has a gap in the scribe line area 104, and the substrate 106 is exposed. In such an embodiment, the molding compound sidewall 502A extends from the top surface of the molding compound layer 502 to the substrate 106. Furthermore, the molding compound layer 502 may encapsulate the second insulating layer 202 and first insulating layer 112.

Figure 5B:
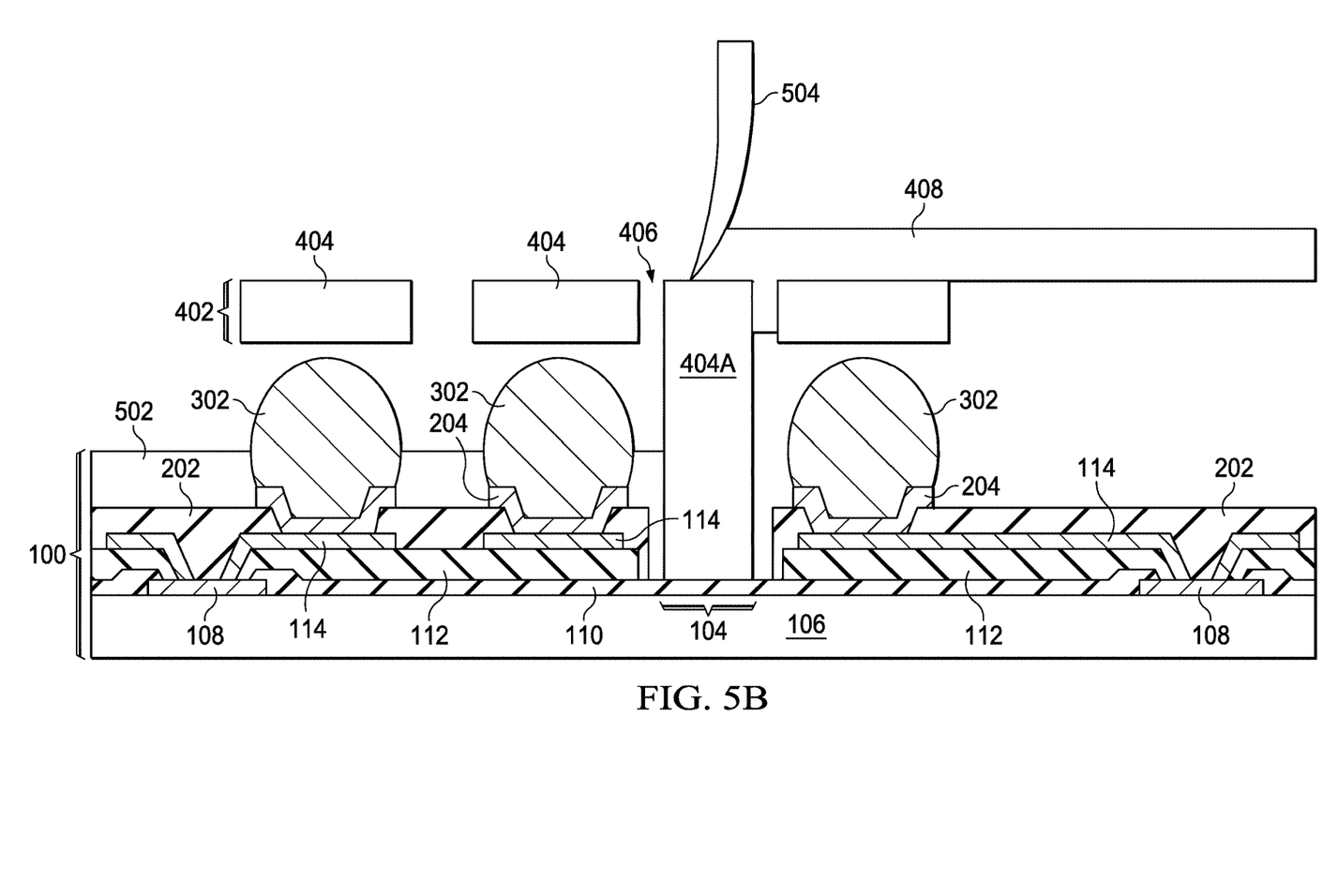

FIG. 5B is a cross-sectional view illustrating forming of the molding compound 408 with a stencil 402 according to an embodiment. The grate 404 over the scribe line 104 has a portion or grate protrusion 404A extending below the body of the stencil 402 toward the wafer 100 to shape the molding compound 408 and prevent the molding compound 408 from flowing under the grate 404 and into the scribe line area 104. The grate protrusion may be used, for example, to retain a low viscosity molding compound over the die area and ensure that the scribe line 104 region remain substantially free of molding compound 408.

Figure 6:
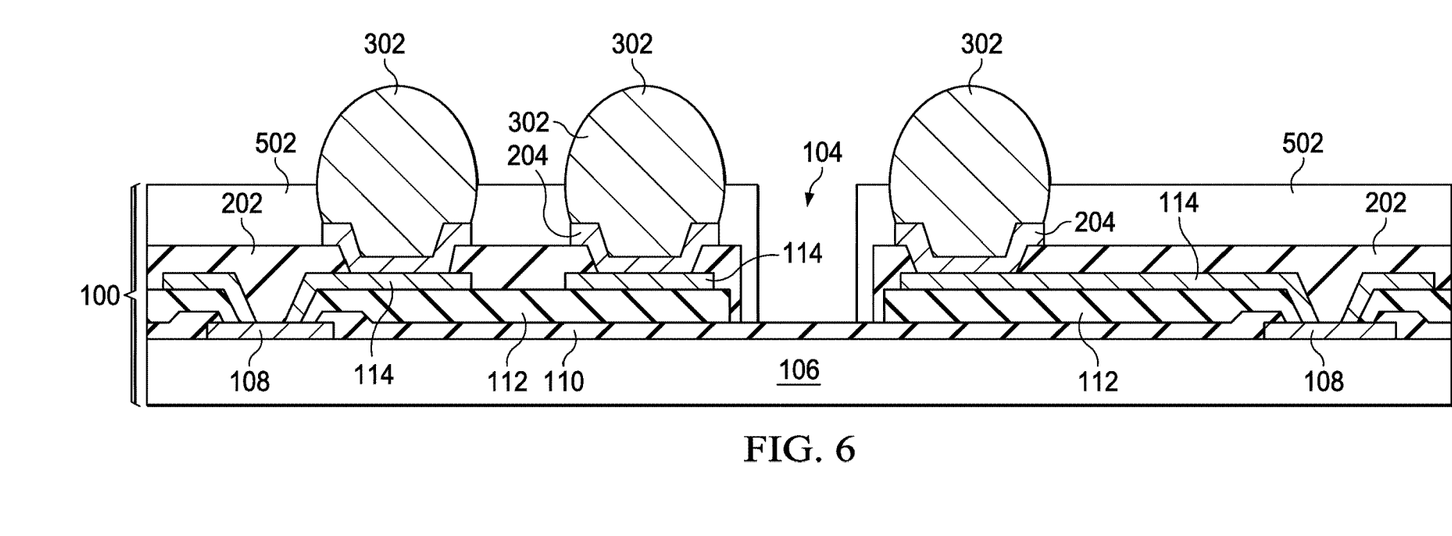

FIG. 6 is a cross-sectional view illustrating the wafer 100 with the molding compound layer 502. The scribe line 104 has no material from the molding compound layer 502 disposed therein. In other words, the molding compound layer 502 has a space or gap in the scribe line area 104, with the passivation layer 110 or substrate 106 exposed for subsequent cutting. The molding compound layer 502 may be cured and the connectors 302 cleaned after curing. A plasma clean process may be applied to the connector 302. In an embodiment, the plasma clean process cleans the connector 302 and removes molding compound layer 502 on the connector 302. The plasma clean process may also remove a portion of the top surface of the molding compound layer 502. In an embodiment, the plasma clean process uses an oxygen plasma, or the like, in an inert atmosphere such a nitrogen, argon, or the like. The plasma clean, in an embodiment, is performed with an power between about 100 watts and about 1000 watts, and in an embodiment, the power of the plasma etch is between about 400 watts and about 700 watts.

Figure 7:
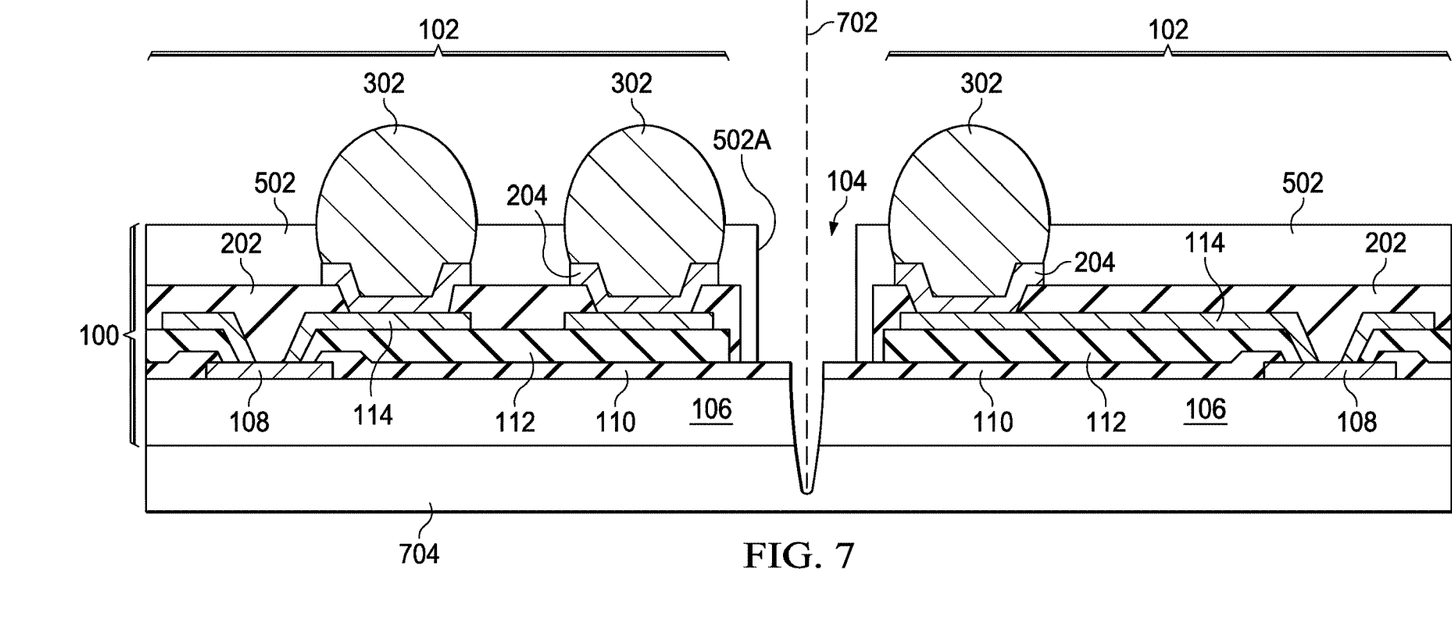

FIG. 7 is a cross-sectional view of cutting the wafer 100 to singulate the dies 102 according to an embodiment. The wafer 100 may have a dicing tape 704 or other supporting structure applied to the bottom side to retain the individual dies 102 as the wafer 100 is cut. In an embodiment, a laser 702 is used to cut through the substrate to separate the dies 102, and the laser 702 may avoid cutting all the way through the dicing tape 704, so that multiple dies are on the dicing tape 704 but separated for packaging and handling convenience. The wafer 100 may be cut using a single pass of a laser 702, or with multiple passes of a single laser or a combination of cutting tools. In an embodiment, the upper layers of the wafer 100, such as a redistribution layer (RDL), active device layers, metallization layers, or the like are cut with a laser 702 in a first pass, and the bulk of the wafer 100 is cut with, for example, a die saw in a second pass. Use of a laser 702 to cut the active device layers prevents delamination of damage to the layers, permitting structures to be formed closer to the edge of the die 102 without risking damaging the structures during die sawing. The bulk of the substrate 106 or wafer body may be cut with a saw having a faster cutting speed or greater cutting depth to account for a relatively thick wafer 100.

The laser 702 may have a width less than the space between the molding compound sidewalls 502A, such that the laser 702 does not cut or otherwise disturb the molding compound layer 502. In an embodiment, the scribe line width may be about 80 µm or greater, and the laser 702 may have a cutting width of about 60 µm. The width of the laser 702 being less than the width of the scribe line 104 creates a buffer zone between the molding compound sidewall 502A and the laser 702 to account for variances in processing or inaccuracies in cutting. Subsequent cuts with, for example, a die saw, may be yet narrower, such as a saw having a width of about 50 µm to prevent cutting outside the initial laser cutting path.

In an embodiment, the cutting laser 702 avoids the molding compound layer 502 to prevent the molding compound layer 502 from absorbing the heat of the laser and introducing reliability problems in the molding compound. Cutting the molding compound layer 502 with the laser 702 may create a plasma plume as the molding compound layer 502 material is vaporized by the laser, with the sides of the molding compound layer 502 cut by the laser 702 thermally deforming or burning. Additionally, cutting the molding compound layer 502 with the laser 702 may create a zone in the molding compound layer 502 around the laser cut region where heat is transmitted to structures or devices, modifying their physical or operating characteristics. Providing an opening in the molding compound layer 502 in the scribe line area 104 permits laser cutting without affecting the integrity of the molding compound layer 502.

Figure 8A:
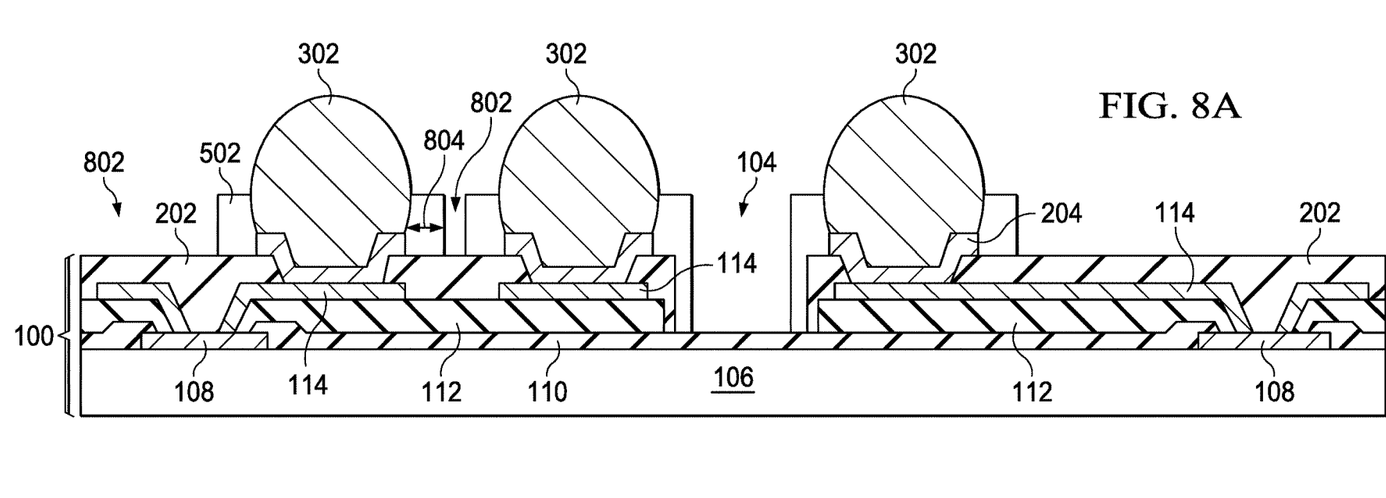
FIGS. 8A through 8C illustrate cross-sectional views of various embodiments of wafers with stenciled molding compound.

FIG. 8A is a cross-sectional view of a wafer 100 having a molding compound layer 502 according to another embodiment. The molding compound layer 502 is formed around and supporting the connectors 302, but may be omitted in regions not immediate adjacent to the connectors 302. Thus, in an embodiment, the molding compound layer 502 has molding compound gaps 802 disposed between the connectors 302. The die 102 may also have regions free of molding compound in areas other than the scribe line 104. In such an embodiment, the molding compound layer 502 portion surrounding each connector 302 may have a width of about 30 µm or more between the edge of the molding compound layer 502 and where the connector 302 joins the wafer 100. Additionally, the molding compound layer 502 maintains the gaps in the scribe line area 104 for laser cutting of the wafer 100. The molding compound gaps 802 provides stress relief during curing of the molding compound layer 502 and resist molding compound layer 502 peeling or cracking.

Figure 8B:
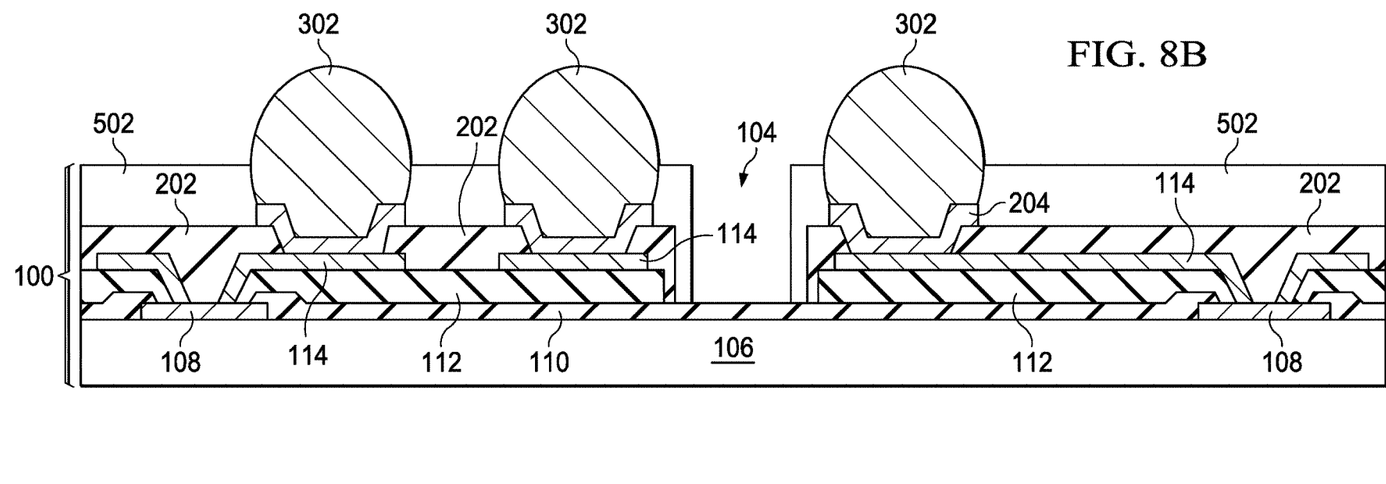

FIG. 8B is a cross-sectional view of a 3-mask arrangement having a molding compound layer 502 according to an embodiment. In such an embodiment, the lands 204 (See, e.g. FIGS. 6-8A) are omitted, with the connectors 302 disposed on PPI 114 and extending over the second insulating layer 202. The molding compound layer 502 and the connectors 302 may both be disposed on and in contact with the second insulating layer 202.

Figure 8C:
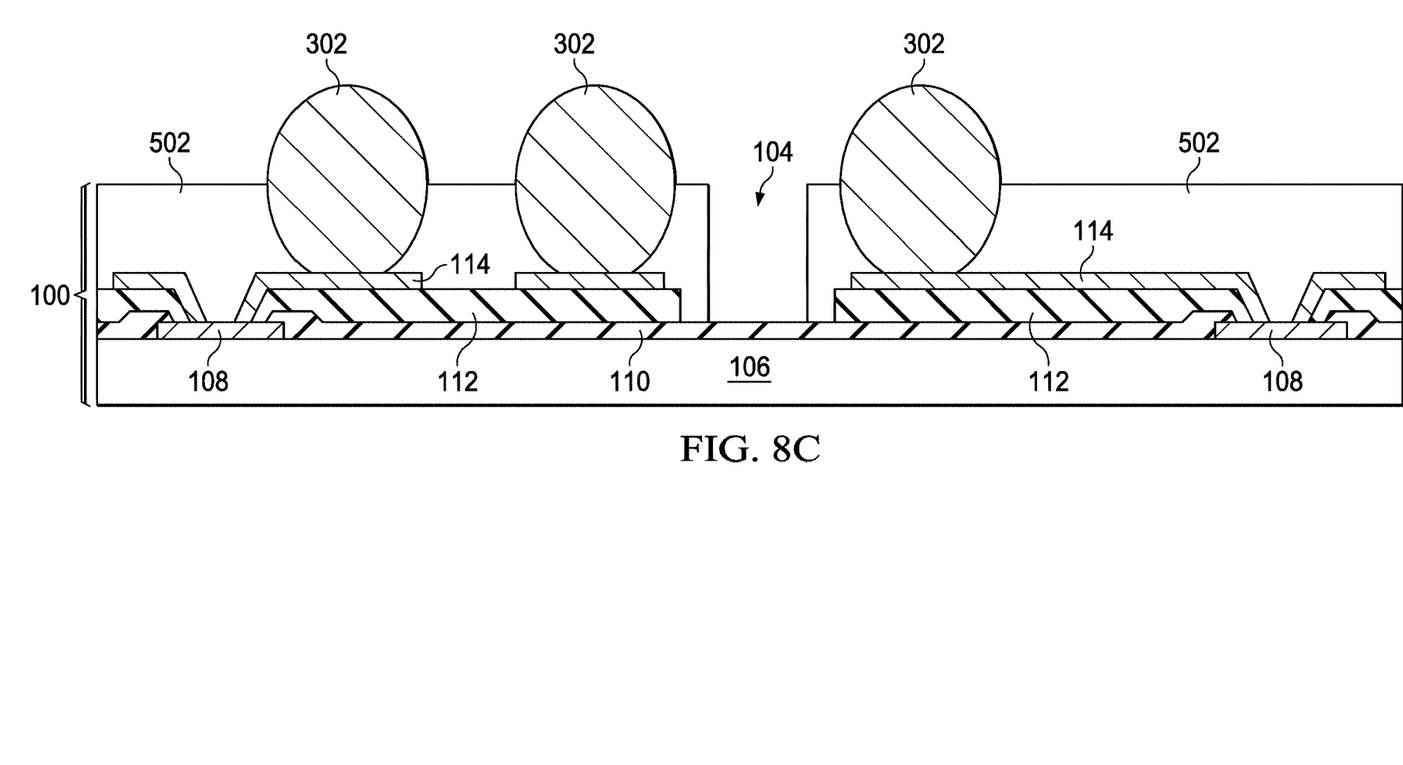

FIG. 8C is a cross-sectional view of a 2-mask arrangement having a molding compound layer 502 according to an embodiment. In such an embodiment, the lands 204 and second insulating layer 202 (See, e.g. FIGS. 6-7) are omitted with the connectors 302 and molding compound layer 502 disposed on PPI 114. The molding compound layer 502 extends past the edge of PPI 114 to contact the first insulating layer 112 and, in an embodiment, contact a portion of the contact pad 108.

Figure 9A:
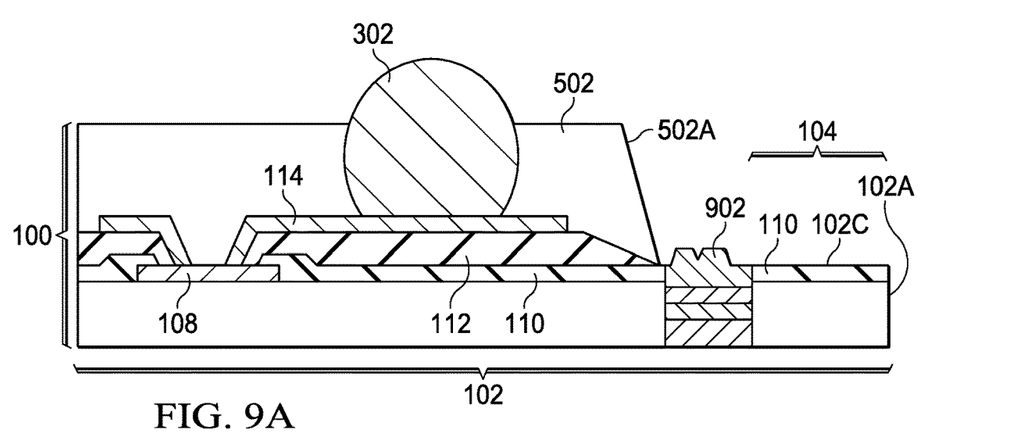
FIG. 9A through 9C illustrate cross section views of portions of dies singulated according to various embodiment.

FIG. 9A is a cross-sectional view illustrating a cut die 102 with seal ring 902. A seal ring 902 comprises of one or more metal structures extending through intermetal dielectric or intermetal dielectric layers on the wafer 100 to the passivation layer. The seal ring 902 borders the die on the outside, providing protection and stability to the upper layers of the substrate. In particular, the seal ring 902 is disposed in the dielectric layers of an RDL, or in intermetal or interlayer dielectric layers. The metal features of the seal ring 902 tend to prevent delamination and cracking of the wafer 100 layers during and after die cutting.

In an embodiment, the molding compound layer 502 extends over the passivation layer 110, over the first insulating layer 112 and over a second insulation layer 202, where included (not shown in this embodiment), but may stop prior to the seal ring 902, leaving the seal ring 902 exposed at the edge of the cut die 102. The die 102 may be cut to result in a die sidewall 102A disposed past the seal ring 902, with a portion of the scribe line area 104 intact after cutting due to the scribe line are 104 being wider than the cutting width of the laser 702 (See, e.g., FIG. 7). Thus, the seal ring 902 and a portion of the passivation layer 110 are exposed outside of the molding compound layer 502 and the die 102 has a die shoulder 102C. In such an embodiment, the molding compound sidewall 502A is disposed between the PPI 114 and the seal ring 902.

Figure 9B:
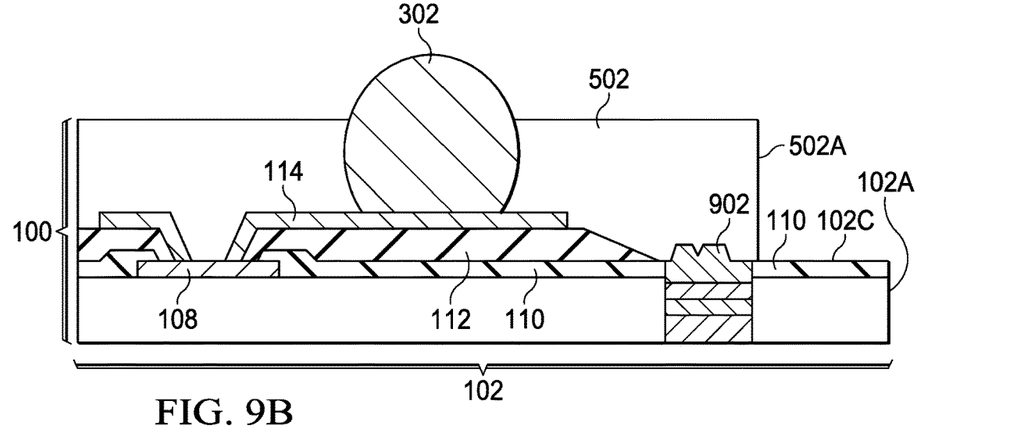

FIG. 9B is a cross-sectional view illustrating a cut die 102 with the molding compound layer 502 extending over the seal ring 902. In such an embodiment, the seal ring 902 is fully or partially covered by the molding compound layer 502. The molding compound sidewall 502A is disposed between the seal ring 902 and the die sidewall 102A. The resulting die 102 has a die shoulder 102C where a portion of the passivation layer 110 extends past the molding compound layer 502 and exposes at least a portion of the top surface of the passivation layer 110.

Figure 9C:
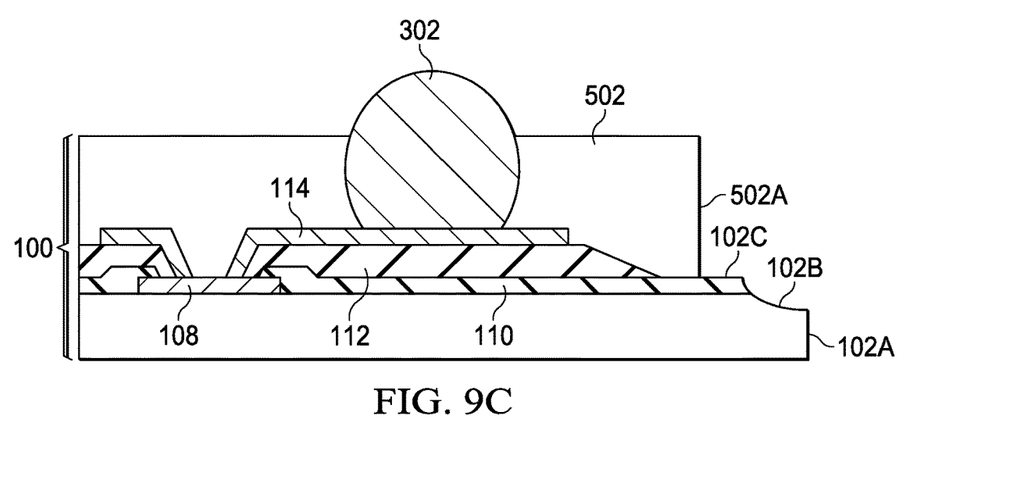

FIG. 9C is a cross-sectional view illustrating a die 102 cut in multiple passes according to an embodiment. A die 102 cut in multiple passes has a recessed die sidewall portion 102B disposed above a vertical portion of the die sidewall 102A. In such an embodiment, the die 102 is partially cut with a laser 702 (See, e.g., FIG. 7) having a first cutting width. The die 102 is subsequently subjected to a final cut with a second cutting apparatus having a second cutting width narrower than the first cutting width. For example, the die 102 may be initially cut with a laser 702, the laser 702 cutting through at least the passivation layer 110 and leaving a recessed die sidewall portion 102B. The die 102 may then be cut a second time with a saw, laser, or the like to form the substantially vertical die sidewall 102A.

Figure 10:
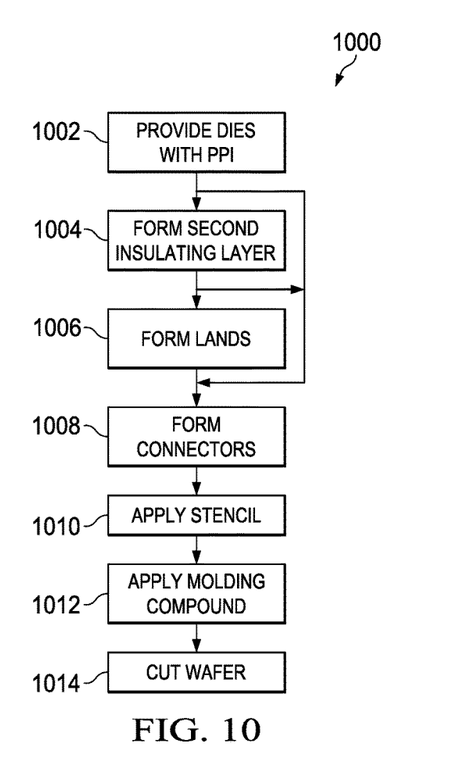
FIG. 10 is a flow diagram illustrating a method of forming and dicing a wafer with stenciled molding compound according to an embodiment.

FIG. 10 is a flow diagram illustrating a method 1000 for cutting a die without disturbing the molding compound layer according to an embodiment. Initially, one or more dies are provided in block 1002. The dies may have one or more PPI structures disposed over a die substrate. A second insulating layer is, for example, in a 3-mask or 4-mask embodiment, formed over the PPI in block 1004 and one or more lands formed over the second insulating layer in block 1006, for example, as in a 4-mask embodiment. In an embodiment such as a 2-Mask embodiment, the second insulating layer is omitted. One or more connectors are formed over the PPI in block 1008. In embodiments where lands are formed in block 1006, the connectors are applied on the lands. A stencil is placed over the dies in block 1010, and molding compound is applied to the dies in block 1012 by forming the molding compound through the stencil. The dies are separated by cutting the wafer in block 1014. The wafer may be cut using a laser, or using a laser in combination with one or more other cutting techniques.

The cutting laser avoiding the molding compound layer prevents the molding compound layer from absorbing the heat of the laser and introducing reliability problems in the molding compound. Additionally, the cutting apparatus avoiding the molding compound layer prevents heat from being transmitted to structures or devices in the die substrate and modifying their physical or operating characteristics. Providing an opening in the molding compound layer in the scribe line area permits laser cutting without affecting the integrity of the molding compound layer. Furthermore, after cutting, the molding compound sidewall maintains a smooth and regular surface that is not modified or burned, resulting in increased reliability.

An embodiment of a method for dicing a wafer comprises forming a molding compound layer over each of one or more dies disposed on a wafer, the one or more dies separated by scribe lines, the molding compound layer having gaps over the respective scribe lines. The wafer is separated into individual dies along the gaps of the molding compound in the scribe lines. Separating the wafer into individual dies comprises cutting at least a portion of the substrate with a laser. Forming the molding compound layer comprises applying a stencil over the one or more dies and using the stencil to form the molding compound layer. The method may further comprise forming at least one connector over each of the dies, the molding compound layer surrounding the at least one connector. Forming the at least one connector may comprise forming the at least one connector over an insulating layer, the insulating layer disposed over a portion of a post-passivation interconnect. Forming the at least one connector may comprise forming the at least one connector over a land, the land disposed a portion of the insulating layer. In an embodiment, the wafer comprises a seal ring, and the molding compound layer extends over the seal ring. In another embodiment, the molding compound layer is outside of the seal ring, the seal ring free of molding compound layer over the seal ring. In an embodiment, cutting the substrate comprises cutting at least a portion of the substrate with a laser. Cutting the substrate may comprise partially cutting the substrate with the laser in a first pass and further comprises cutting through the substrate in a second pass.

Another embodiment of a method for dicing a wafer comprises forming least one connector is formed over each die of a plurality of dies on a substrate, the plurality of dies separated by a plurality of scribe lines. A molding compound layer is formed and around the at least one connector, the molding compound layer having a plurality of portions each disposed over respective ones of the plurality of dies, the molding compound layer avoiding the plurality of scribe lines. The substrate is cut in the plurality of scribe lines with a laser, the laser avoiding cutting the molding compound layer. Forming the at least one connector may comprise forming a plurality of connectors over each of the plurality of dies, wherein a sidewall of each of the molding compound layer portions has a sidewall extending from a top surface of the molding compound layer to a passivation layer of the substrate. In an embodiment, the molding compound layer is formed with a stencil having a grate positioned between two of the plurality of dies, the grate of the stencil forming a first space in the molding compound layer between the molding compound portions. In an embodiment, forming the molding compound layer comprises forming the each molding compound layer portion with a second space between two of the plurality of connectors. The stencil has a grate positioned between two of the plurality of connectors, the grate of the stencil forming the space in the molding compound layer between the two of the plurality of connectors.

A die according to an embodiment comprises a die substrate having a plurality of contact pads disposed thereon, the die substrate extending to a sidewall of the die, at least one post passivation interconnect (PPI) disposed over the die substrate, the at least one PPI in contact with a respective one of the plurality of contact pads, at least one connector over and in electrical contact with the at least one PPI, and a molding compound layer disposed over the at least one PPI and around the at least one connector, each at least one connector extending above a top surface of the molding compound layer, and the molding compound having a sidewall disposed between the die sidewall and the at least one PPI. In an embodiment, the substrate comprises a seal ring, and the molding compound layer extends over the seal ring. In another embodiment, the substrate comprises a seal ring, and the molding compound layer has a molding compound sidewall disposed between the at least one connector and the seal ring. The substrate may comprise a passivation layer disposed over the die substrate, with the at least one PPI disposed over the passivation layer, and the passivation layer may have a portion adjacent to the sidewall of the die free of any portion of the molding compound layer. In an embodiment, the molding compound sidewall extends from a top surface of the molding compound layer to the passivation layer, and in an embodiment, a recessed die sidewall portion is disposed above a vertical die sidewall portion.

Although embodiments of the present disclosure and their advantages have been described in detail, it should be understood that various changes, substitutions and alterations can be made herein without departing from the spirit and scope of the disclosure as defined by the appended claims. For example, it will be readily understood by those of ordinary skill in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a substrate;
a contact pad disposed on the substrate;
a plurality of conductive lines disposed over the substrate, a first conductive line of the plurality of conductive lines being electrically connected to the contact pad;
a first insulating layer disposed over the plurality of conductive lines;
a second insulating layer directly under the plurality of conductive lines, wherein the first insulating layer extends along a sidewall of the second insulating layer;
a passivation layer under the second insulating layer;
a first connector disposed over the first conductive line;
a second connector disposed over the first insulating layer next to the first connector; and
a first molding compound disposed over the first insulating layer around the first connector, the first connector extending beyond a surface of the first molding compound that is farthest from the substrate; and
a second molding compound disposed over the first insulating layer around the second connector, the second connector extending beyond a surface of the second molding compound that is farthest from the substrate, wherein the first molding compound is physically separate from the second molding compound, wherein the second molding compound and the first insulating layer each contact a top surface of the passivation layer, wherein the second molding compound extends below a bottommost surface of the first molding compound.

2. The semiconductor device of claim 1, further comprising:
a plurality of lands, wherein each of the plurality of lands electrically connects a conductive line of the plurality of conductive lines to a connector of a plurality of connectors, the plurality of connectors including the first connector and the second connector.

3. The semiconductor device of claim 1, wherein the first molding compound and the second molding compound have a same thickness over the first insulating layer.

4. The semiconductor device of claim 1, wherein the second molding compound extends along a sidewall of the first insulating layer.

5. The semiconductor device of claim 1, wherein the second molding compound extends along a sidewall of the second insulating layer.

6. The semiconductor device of claim 1, wherein the passivation layer contacts sidewalls of the contact pad.

7. The semiconductor device of claim 1, wherein a sidewall of the first molding compound overlies the contact pad.

8. The semiconductor device of claim 1, wherein a surface of the first insulating layer is exposed between the first molding compound and the second molding compound.

9. A device, comprising:
a substrate;
a first insulating layer disposed over the substrate;
a passivation layer under the first insulating layer;
a plurality of conductive lines disposed over the first insulating layer;
a second insulating layer disposed over the first insulating layer, wherein the second insulating layer extends along a sidewall of the first insulating layer;
a plurality of connectors disposed over the second insulating layer, wherein each of the plurality of connectors is electrically connected to a conductive line of the plurality of conductive lines; and
a molding layer over the second insulating layer, the molding layer surrounding each of the plurality of connectors, wherein a gap separates a first portion of the molding layer from a second portion of the molding layer, the gap exposes a top surface of the second insulating layer, the first portion of the molding layer surrounding a first connector of the plurality of connectors, the second portion of the molding layer surrounding a second connector of the plurality of connectors, the first insulating layer and the molding layer each contacting a top surface of the passivation layer, and wherein the second portion of the molding layer extends below a bottommost surface of the first portion of the molding layer.

10. The device according to claim 9, further comprising:
a contact pad disposed on the substrate, wherein a first conductive line of the plurality of conductive lines is connected to the contact pad.

11. The device according to claim 9, wherein a thickness of the first portion of the molding layer and the second portion of the molding layer over the second insulating layer are the same.

12. The device according to claim 9, wherein a thickness of the second portion of the molding layer is greater than a thickness of the first portion of the molding layer.

13. The device according to claim 9, wherein the second portion of the molding layer extends beyond a surface of the first portion of the molding layer that is closest to the substrate.

14. A device comprising:
a contact pad of a semiconductor die;
a first conductive line electrically connected to the contact pad;
a second conductive line adjacent the first conductive line;
a first insulating layer over the first conductive line and the second conductive line;
a second insulating layer directly under the first conductive line and the second conductive line, and wherein the first insulating layer extends along a sidewall of the second insulating layer;
a passivation layer under the second insulating layer;
a first solder region electrically connected to the first conductive line;
a second solder region electrically connected to the second conductive line;
a first molding compound over the first insulating layer and disposed around the first solder region; and
a second molding compound over the first insulating layer and disposed around the second solder region, wherein a top surface of the first insulating layer is exposed between the first molding compound and the second molding compound, and wherein the second molding compound and the first insulating layer each contact a top surface of the passivation layer, and wherein the second molding compound extends below a bottom-most surface of the first molding compound.

15. The device of claim 14, wherein the second molding compound extends along a sidewall of the first insulating layer.

16. The device of claim 14, wherein a sidewall of the first molding compound faces a sidewall of the second molding compound in an area between the first solder region and the second solder region.

17. The device of claim 14, wherein the first molding compound and the second molding compound extend a same distance away from a top surface of the first insulating layer.

18. The device of claim 14, wherein a thickness of the second molding compound is greater than a thickness of the first molding compound.

19. The device of claim 14, wherein the second molding compound extends along a sidewall of the second insulating layer.

20. The device of claim 14, wherein the passivation layer touches a sidewall of the contact pad.

* * * * *